United States Patent
Kanan

(10) Patent No.: US 9,786,174 B1
(45) Date of Patent: Oct. 10, 2017

(54) POWER CONSUMPTION ENHANCED PARKING SYSTEM

(71) Applicant: Abu Dhabi University, Abu Dhabi (AE)

(72) Inventor: Riad Kanan, Abu Dhabi (AE)

(73) Assignee: Abu Dhabi University (AE)

( * ) Notice: Subject to any disclaimer, the term of this patent is extended or adjusted under 35 U.S.C. 154(b) by 0 days.

(21) Appl. No.: 15/146,048

(22) Filed: May 4, 2016

(51) Int. Cl.
| | |
|---|---|
| B60Q 1/48 | (2006.01) |
| G08G 1/14 | (2006.01) |
| H04W 4/00 | (2009.01) |
| G06F 1/32 | (2006.01) |
| G08G 1/127 | (2006.01) |
| H04W 52/02 | (2009.01) |
| H02J 3/38 | (2006.01) |
| H02S 40/38 | (2014.01) |

(52) U.S. Cl.
CPC .......... *G08G 1/141* (2013.01); *G06F 1/3206* (2013.01); *G08G 1/127* (2013.01); *H02J 3/383* (2013.01); *H02S 40/38* (2014.12); *H04W 4/008* (2013.01); *H04W 52/0225* (2013.01)

(58) Field of Classification Search
CPC ........ G08G 1/141; G08G 1/127; H02S 40/38; G06F 1/3206; H02J 3/383; H04W 4/008; H04W 52/0225
USPC ...................................... 340/932.2
See application file for complete search history.

(56) References Cited

U.S. PATENT DOCUMENTS

| | | | |
|---|---|---|---|
| 6,340,935 B1 * | 1/2002 | Hall | G08G 1/14 340/905 |
| 2012/0188101 A1 * | 7/2012 | Ganot | G07B 15/02 340/932.2 |
| 2013/0282448 A1 * | 10/2013 | Rydbeck | G06Q 20/145 705/13 |

* cited by examiner

*Primary Examiner* — Kerri McNally
(74) *Attorney, Agent, or Firm* — Hayes Soloway PC

(57) ABSTRACT

There is provided a parking system comprising a parking lot device and a parking vehicle device configured for an enhanced management of power consumption such that the parking lot device uses self-generated energy and conducts tasks requiring a lower power consumption level and wherein the parking vehicle device uses the vehicle battery and is configured to conduct tasks requiring a higher power consumption level, where both the PLD and the PVD are configured to work in a coordinated manner to sleep and wake up only when required in order to minimize power consumption.

15 Claims, 4 Drawing Sheets

POWER CONSUMPTION ENHANCED PARKING SYSTEM

FIELD OF THE INVENTION

The present invention is related to the field of parking systems, and more particularly, to a power consumption enhanced parking system comprising a parking vehicle device and a parking lot device configured to work in coordination for minimizing power consumption.

BACKGROUND OF THE INVENTION

Traditional parking systems use vehicle detection sensors which are normally deployed in large numbers and positioned in areas within parking lots with difficult access, which makes it generally cumbersome to timely detect energy consumption of sensors and change the sensor batteries during use. As these parking sensors communicate with remote parking monitoring systems using long range signals, the power consumption level of these sensors is normally high which affects substantially their batteries life time.

Some traditional systems limited the communication of these devices to short range communication such that the communication with the remote parking monitoring systems is conducted by routing a signal through a series of adjacent parking devices using the individual parking devices as routers. This way of routing the signal is cumbersome and results in using additional electronic components which add in to the power consumption.

SUMMARY OF THE INVENTION

The present invention provides a power consumption enhanced parking system 2 adapted to enhance management of power being consumed during use.

Therefore, there is a benefit in minimizing power consumption of parking lot sensors mounted in parking lots hardly accessible for human intervention for monitoring and maintenance purposes. This is in order to extend the life time of their batteries or other energy storage units as much as possible. There is also a benefit in self generating energy using a renewable source of energy for providing power to parking lot sensors in order to enhance life time and operability of such sensors by relying less on human intervention for monitoring and maintaining operability of these sensors during use.

As a first aspect of the invention, there is provided a parking lot device (PLD) adapted to be mounted in a parking lot comprising:
  a solar cell for capturing and converting solar energy into electrical energy;
  an energy storage unit adapted to be connected to the solar cell for storing the electrical energy and providing electrical power supply to the PLD;
  an energy level detector adapted to be connected to the solar cell for providing an indication when a level of energy captured by the solar cell is below a predefined energy level threshold set in such a manner to be indicative of a presence or absence of an obstacle shadowing the solar cell;
  a memory storing a parking lot identifier associated with the parking lot;
  a short range radio frequency transceiver (PLD SR RF Transceiver) adapted to be activated when the solar energy level is determined by the energy level detector to be below the predefined energy level threshold for transmitting a short range radio frequency signal comprising the parking lot identifier, wherein the transmitted signal is adapted to be received by a short range radio frequency transceiver associated with a parking vehicle device (PVD) located at vehicle parked inside the parking lot.

Preferably, the PLD SR RF Transceiver is adapted to be by default in a sleep mode and to be activated only when the level of solar captured is below the energy level threshold as determined by the energy level detector.

Preferably, the PLD SR RF Transceiver is adapted to return to a sleep mode immediately after transmitting the signal comprising the parking lot identifier to the PVD.

Preferably, the PLD SR RF Transceiver is adapted to return to a sleep mode when the level of solar energy captured passes beyond the energy level threshold as determined by the energy level detector.

Preferably, the parking lot device further comprises an infrared detector adapted to be activated to confirm presence of an obstacle in case the solar energy level detected falls below the predefined threshold, wherein the PLD SR RF Transceiver is adapted to be activated only once presence of an obstacle is confirmed by the infrared detector.

Preferably, the infrared detector is by default in a sleep mode and activated only when the solar energy level detected falls below the predefined threshold.

Preferably, the parking lot device further comprises a clock and the memory further stores a night schedule, wherein the infrared detector is adapted to be activated only during the night schedule.

Preferably, the energy storage unit is a battery or a capacitor.

As a further aspect of the invention, there is provided a parking vehicle device (PVD) adapted to be mounted at a vehicle comprising:
  a short range radio frequency transceiver (PVD SR RF Transceiver) adapted to be in radio frequency communication with a short range radio frequency transceiver in a parking lot device (PLD SR RF Transceiver) for receiving a short range radio frequency signal comprising a parking lot identifier;
  a long range radio frequency transceiver (PVD LR RF Transceiver) adapted to be in communication with a remote parking monitoring system (RPMS) for transmitting thereto an indication of the occupancy of the parking lot associated with the parking lot identifier;
  a power supply unit adapted to receive electrical power from a vehicle power storage unit, to regulate and provide the power to the PVD.

Preferably, the parking vehicle device further comprises a memory storing a vehicle identifier, wherein the long range signal transmitted to the RPMS further comprises the vehicle identifier.

Preferably, the PLD SR RF Transceiver is adapted to be in a default sleep mode and wherein the PVD SR RF Transceiver is adapted to send an activation signal to the PLD SR RF Transceiver, said PLD SR RF Transceiver transmitting said parking lot identifier in response to said activation signal.

Preferably, the PVD SR RF Transceiver is adapted to be in a default sleep mode and to be activated only upon receipt of a wake up signal from the RPMS through the PVDV LR RF Transceiver, wherein the activation signal transmitted by the PVD SR RF Transceiver to the PLD SR RF Transceiver is transmitted only after receiving the wake up signal from the RPMS.

Preferably, the parking vehicle device further comprises a geolocation tracking system adapted to report location of the vehicle to the RPMS, wherein the RPMS is adapted to determine whether the vehicle is within a parking zone based on the vehicle location and stored parking zone locations and to transmit a wake up signal to the PVD only in case the vehicle is determined by the RPMS to be in a parking zone.

As another aspect of the invention, there is provided a parking system comprising:
a parking lot device (PLD) adapted to be mounted in a parking lot comprising:
  a solar cell for capturing and converting solar energy into electrical energy;
  an energy storage unit adapted to be connected to the solar cell for storing the electrical energy and providing electrical power supply to the PLD;
  an energy level detector adapted to be connected to the solar cell for providing an indication when a level of energy captured by the solar cell is below a predefined energy level threshold set in such a manner to be indicative of a presence or absence of an obstacle shadowing the solar cell;
  a memory storing a parking lot identifier associated with the parking lot;
  a short range radio frequency transceiver (PLD SR RF Transceiver) adapted to be activated when the solar energy level is determined by the energy level detector to be below the predefined energy level threshold for transmitting a short range radio frequency signal comprising the parking lot identifier;
a parking vehicle device (PVD) adapted to be mounted at a vehicle comprising:
  a short range radio frequency transceiver (PVD SR RF Transceiver) adapted to be in radio frequency communication with the PLD SR RF Transceiver for receiving the short range radio frequency signal comprising the parking lot identifier;
  a long range radio frequency transceiver (PVD LR RF Transceiver) adapted to be in communication with a remote parking monitoring system (RPMS) for transmitting thereto an indication of the occupancy of the parking lot associated with the parking lot identifier;
  a power supply unit adapted to receive electrical power from a vehicle power storage unit, to regulate and provide the power to the PVD.

Preferably, the PLD SR RF Transceiver is adapted to be by default in a sleep mode and to be activated only upon receipt of an activation signal from the PVD SR RF Transceiver.

Preferably, the PVD SR RF Transceiver is adapted to send an activation signal to the PLD SR RF Transceiver only after receipt of a wake up signal from the RPMS through the PVD LR RF Transceiver.

Preferably, the parking vehicle device further comprises a geolocation tracking system adapted to transmit a location of the vehicle to the RPMS, and wherein the RPMS is adapted to determine whether the vehicle is within a parking zone and to transmit the wake up signal to the PVD LR RF Transceiver only if the vehicle is determined to be in a parking zone.

Preferably, the PLD SR RF Transceiver is adapted to be by default in a sleep mode and to be activated only when the level of solar captured is below the energy level threshold as determined by the energy level detector.

Preferably, the PLD SR RF Transceiver is adapted to return to a sleep mode immediately after transmitting the signal comprising the parking lot identifier to the PVD.

Preferably, the PLD SR RF Transceiver is adapted to return to a sleep mode when the level of solar energy captured passes beyond the energy level threshold as determined by the energy level detector.

DETAILED DESCRIPTION OF THE INVENTION

Figure 1:
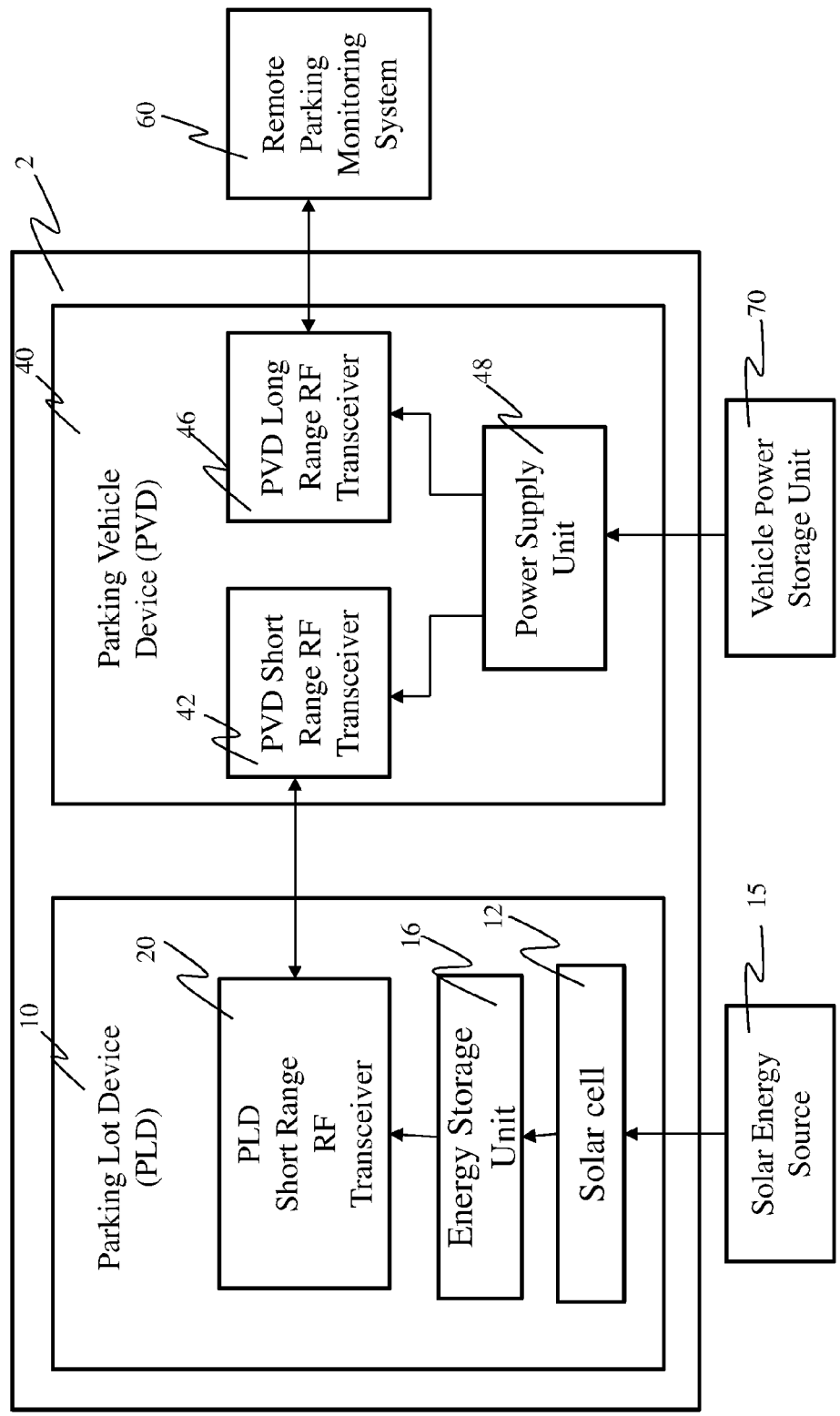
FIG. 1 illustrates a power consumption enhanced parking system in accordance with an embodiment of the present invention.

In an aspect of the invention, as illustrated in FIG. 1, the system 2 comprises a self-powered parking lot device (PLD) 10 adapted to be mounted within a parking lot and configured with a respective parking lot identifier. The system 2 further comprises a parking vehicle device (PVD) 40 adapted to be mounted at a vehicle and preferably configured with a respective vehicle identifier. The parking lot device 10 comprises a short range radio frequency transceiver 20 (also called PLD SR RF Transceiver) and the vehicle parking device 40 comprises a short range radio frequency transceiver 42 (also named VPD SR RF Transceiver) adapted to be in communication with the PLD SR RF Transceiver 20.

In an embodiment of the invention, the parking lot device 10 comprises an energy storage unit 16 adapted to store and provide electrical energy to the PLD SR RF Transceiver 20 and to the other electronic components of the parking lot device 10, where the parking vehicle device 40 comprises a power supply unit 48 adapted to enable power supply to the VPD SR RF Transceiver 42 and other electronic components of the parking vehicle device 40.

In an embodiment of the invention, the energy storage unit 16 is a battery. In another embodiment of the invention, the energy storage unit 16 is a capacitor.

In an embodiment of the invention, the power supply unit 48 is a battery. In another embodiment of the invention, the power supply unit 48 comprises a power regulator adapted to be connected to the vehicle battery for receiving electrical power from the vehicle power and regulating the electrical power into a suitable form for powering the electronic components of the parking vehicle device 40.

In an embodiment of the invention, the parking lot device 10 further comprises a solar cell 12 adapted to be connected to the energy storage unit 16. The solar cell 12 is adapted to capture solar energy from a solar energy source 15, convert the solar energy into electrical energy, and store the electrical energy converted inside the energy storage unit 16. From the vehicle side, the power supply unit 48 of the parking vehicle device 40 is adapted to be connected to vehicle power supply unit 70 for receiving, regulating, storing and providing electrical power to the PVD SR RF Transceiver 42 and other electronic components of the parking vehicle device 40.

In an embodiment of the invention, the parking vehicle device 40 further comprises a long range radio frequency transceiver 46 (also named PVD LR RF Transceiver) adapted to be in long range radio frequency communication with a remote parking monitoring and computing system 60 (also named RPMS). The PVD LR RF Transceiver 46 is adapted to be connected to the power supply unit 48 for receiving the required electrical power for operation.

In an embodiment of the invention, the system 2 of the present invention is adapted to enable enhanced power management of the various electronic components such that the energy used by the parking lot device 10 is minimized by limiting the communication of this parking lot device 10 with the in proximity parking vehicle device 40 using a short range RF communication which requires a low energy level for operation. The long range RF communication with the RPMS 60 is conducted at the vehicle side only using the parking vehicle device 40 which has access to a larger source of power as the PVD 40 is provided with a power supply unit 48 adapted to receive and regulate electrical power from the vehicle power storage unit 70 such as the vehicles battery. Also, the adaptation of the parking lot device 10 to self-generate electrical energy is another feature which allows an enhanced management of the power consumption of the system 2.

In an embodiment of the invention, the system 2 is designed such that the parking lot device 10 is configured with operations/functions requiring low power consumptions which can be sustained using self-generated electrical power converted from solar energy using the solar cell 20. The operations/functions requiring higher power consumptions, such as long range radio frequency communications with the RPMS 60, are configured to be conducted by the parking vehicle device 40 which is adapted to receive power for operation from the vehicle power storage unit 70 such as the vehicle battery where energy availability and accessibility is not an issue. The long range radio frequency communication between the parking vehicle device 40 and the RPMS 60 allows to avoid any need of routing such a communication through a series of short range communication devices.

Figure 2:
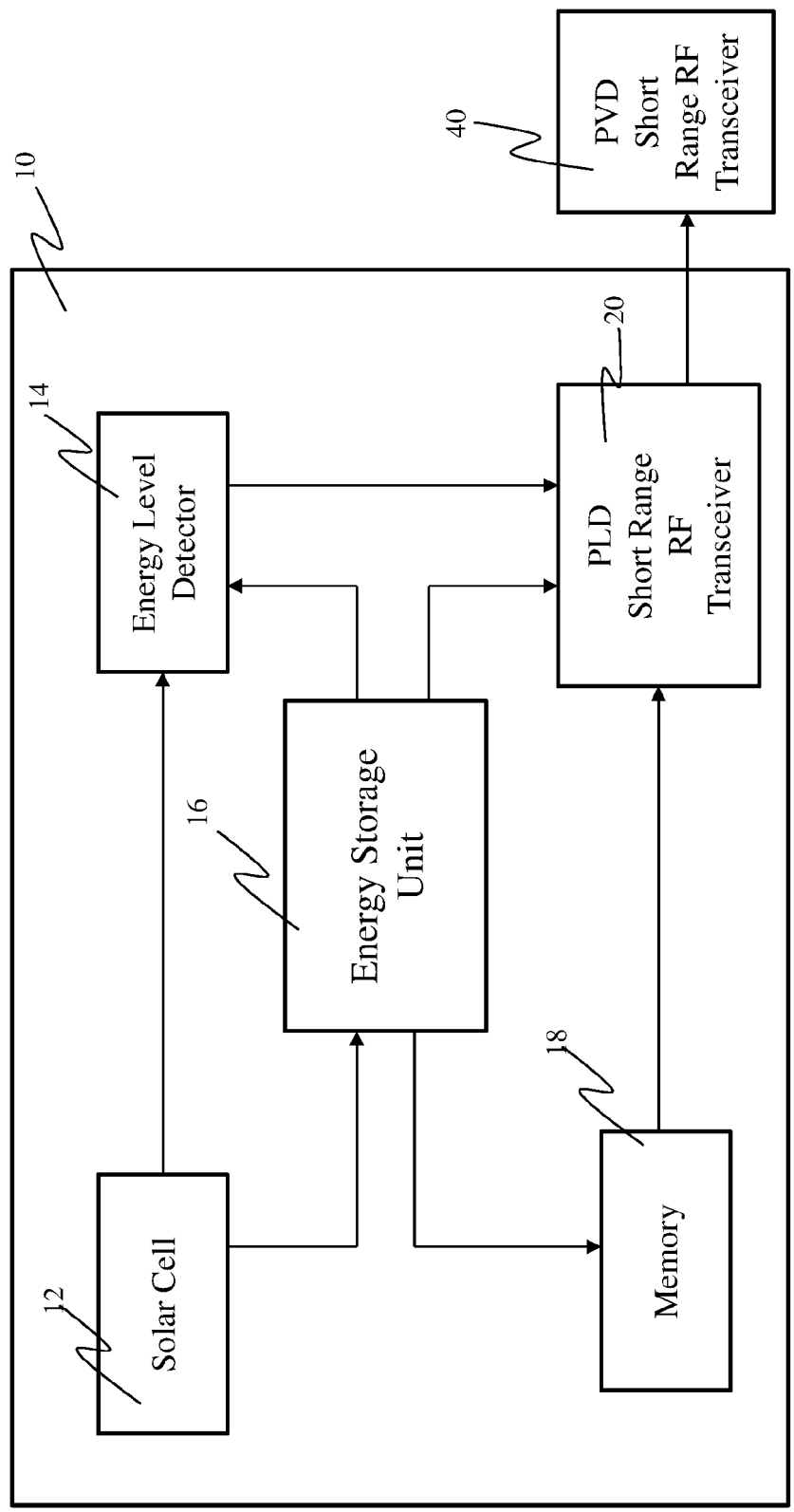
FIG. 2 illustrates a parking lot device in accordance with an embodiment of the present invention.

Referring to FIG. 2, there is provided a parking lot device (PLD) 10 in accordance with an embodiment of the invention. The PLD 10 comprises a solar cell 12, an energy level detector 14, an energy storage unit 16, a memory 18 and a PLD short range radio frequency transceiver 20 (PLD SR RF Transceiver).

In an embodiment of the invention, the solar cell 12 is adapted to capture solar energy and to convert solar energy into electrical energy. The solar cell 12 is adapted to be connected to the energy storage unit 16 for storing the converted electrical energy. The energy storage unit 16 is adapted to be connected to the energy level detector 14, to the memory 18 and to the PLD SR RF Transceiver 20 for providing electrical power thereto.

In an embodiment of the invention, the energy level detector 14 is adapted to be connected to the solar cell 12 for detecting the level of energy captured by the solar cell 12 and for comparing the detected level of energy to a predefined energy level threshold which is set in such a manner to be indicative of a presence or absence of an obstacle (such as a vehicle) shadowing the solar cell 12. In case an obstacle is present shadowing the solar cell 12, the level of energy captured by the solar cell 12 will fall under the defined threshold, whereas if no obstacle is present shadowing the solar cell 12, the level of energy captured will be beyond the predefined threshold.

In an embodiment of the invention, the PLD 10 is adapted to be mounted on the ground floor of a parking lot such that a vehicle would be positioned directly above the PLD 10 (and therefore above the solar cell 12) when parked inside the parking lot. Therefore, the solar cell 12 will be positioned directly below the parked vehicle and will be shadowed from light/sun as long as the vehicle remains in a parking position which leads to a drop in the amount of solar energy captured by the solar cell 12 under the predefined threshold which will be indicative of a presence of an obstacle.

In an embodiment of the invention, presence or absence of an obstacle (such as a vehicle) is detected by comparing the level of energy captured by the solar cell 12 to the predefined energy level threshold and by determining whether the level of energy captured by the solar cell 12 falls below or beyond the predefined threshold.

In an embodiment of the invention, the energy level detector 14 is adapted to activate the PLD SR RF Transceiver 20 only in case the level of energy captured is determined to be lower than the predefined threshold which would be indicative of presence of an obstacle (such as a vehicle). This allows for an enhanced management of energy use as the PLD RF transceiver 20 will be activated for operation only in case an obstacle (such as a vehicle) is detected which would allow to minimize power consumption.

In an embodiment of the invention, when the level of energy detected by the energy level detector 14 is under the predefined energy level threshold (which is indicative of absence of an obstacle), the PLD RF Transceiver 20 is put in a sleep mode for reducing power consumption (since this is interpreted as absence of a parked vehicle and therefore there is no need for the transceiver to be in operation). In an embodiment of the invention, the energy level detector 14 sends a sleep signal to the PLD RF Transceiver 20 for putting the latter in a sleep mode. In an embodiment of the invention, the whole PLD is put in a sleep mode except the energy level detector 14, the solar cell 12 and the energy storage unit 16.

The PLD SR RF transceiver 20 is adapted to be in short range radio frequency communication with the PVD SR RF Transceiver 40. Once an obstacle is detected by the energy level detector 14, the PLD SR RF Transceiver 20 sends a short range RF signal to the PVD SR RF Transceiver 40 comprising the parking lot identifier.

In an embodiment of the invention, the PLD SR RF transceiver 20 is adapted to be connected to the memory 18 which stores the unique parking lot identifier allowing to uniquely identify the parking lot associated to the PLD 10. The PLD SR RF Transceiver 20 is adapted to read and receive the parking lot identifier from the memory 18.

In an embodiment of the invention, the parking lot identifier comprises an identifier allowing identification of the parking zone in which the lot is located and an identifier allowing identification of the specific lot in which the PLD is mounted.

Figure 3:
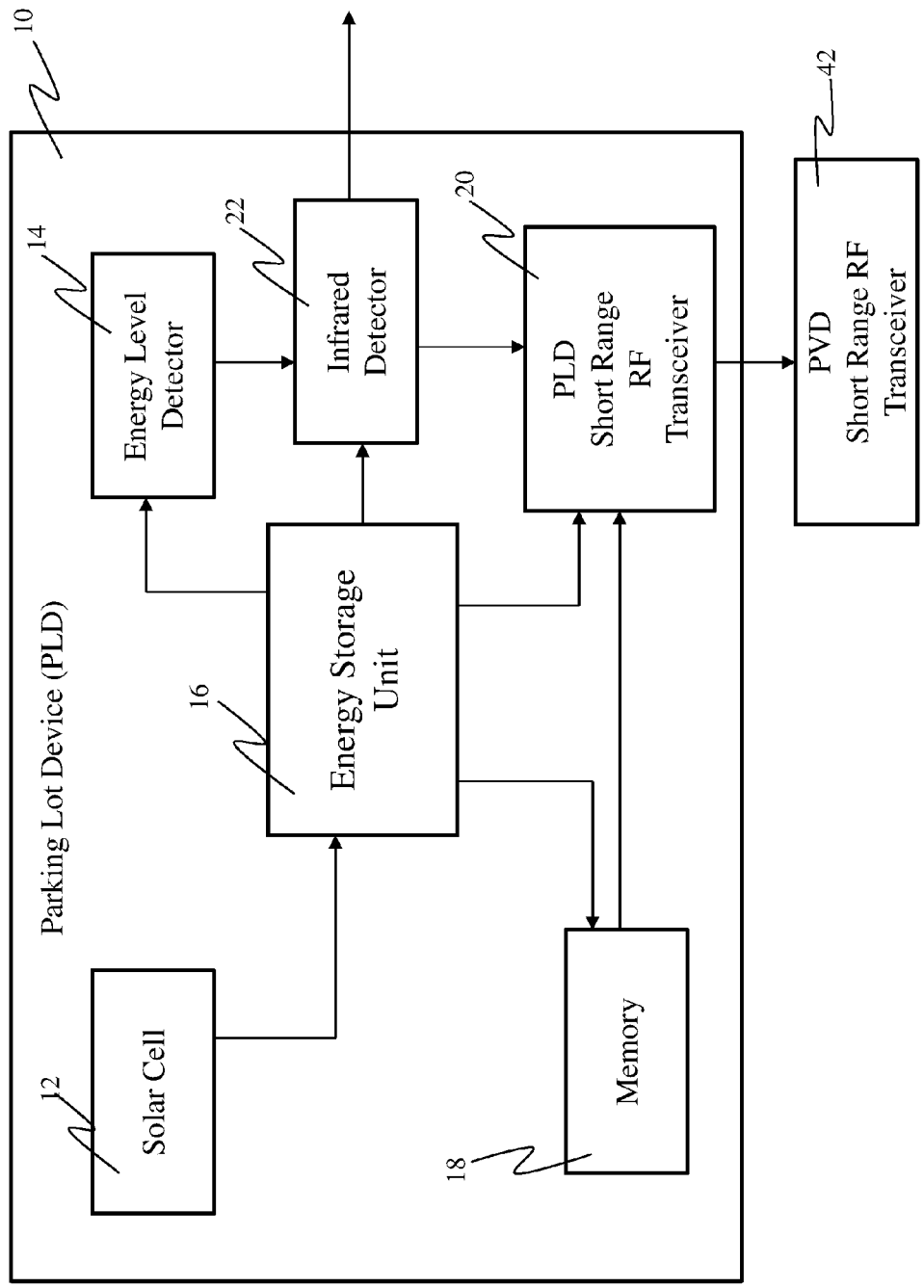
FIG. 3 illustrates a parking lot device adapted for night use in accordance with an embodiment of the present invention.

As illustrated in FIG. 3, in an embodiment of the invention, the parking lot device 10 further comprises an infrared detector 22 adapted to be connected to the energy storage unit 16 which is adapted to provide electrical power for the operation of the infrared detector 22.

In an embodiment of the invention, the infrared detector 22 is adapted to send an infrared signal to confirm presence of an obstacle when the energy level detector 14 determines an energy level below the predefined threshold. According to this embodiment, the PLD SR RF Transceiver 20 is adapted to transmit a short range RF signal comprising the parking lot identifier only in case the infrared detector 22 confirms than an obstacle is present.

In an embodiment of the invention, as illustrated in FIG. 3, the energy level detector 14 is connected to the infrared detector 22 for activating the infrared detector 22 in case the energy level detected falls below the predefined energy level threshold.

In an embodiment of the invention, the infrared detector 22 is connected to the PLD SR RF Transceiver 20 for activation in case the infrared detector 22 confirms presence of an obstacle.

In an embodiment of the invention, the infrared detector 22 is employed in dark environments and/or instances, such as at night time, when the solar energy level is normally low and a detection of a low energy level by the energy level detector 14 may not be indicative of a presence of an obstacle. In these instances, the infrared detector 22 is used to confirm whether or not an obstacle is present.

In an embodiment of the invention, the infrared detector 22 is configured to operate independently from the energy level detector 14 and to send infrared signals at different time intervals, such as every one minute, to detect presence of an obstacle.

In an embodiment of the invention, the parking lot device 10 further comprises a clock (not shown) for providing a time signal to the device 10. According to an embodiment of the invention, the infrared detector 22 is adapted to operate at night time only as per a predefined time schedule which can be stored inside the memory 18. The night time would in this case be determined according to the time reading of the clock (not shown).

The connection configuration provided above between the different components of the parking lot device 10 is one possible configuration. In an embodiment of the invention, there is provided a control block unit (not shown) adapted to be connected to the various components for coordinating their operations. The control block unit can be an electronic circuit with or without a microcontroller (not shown).

Figure 4:
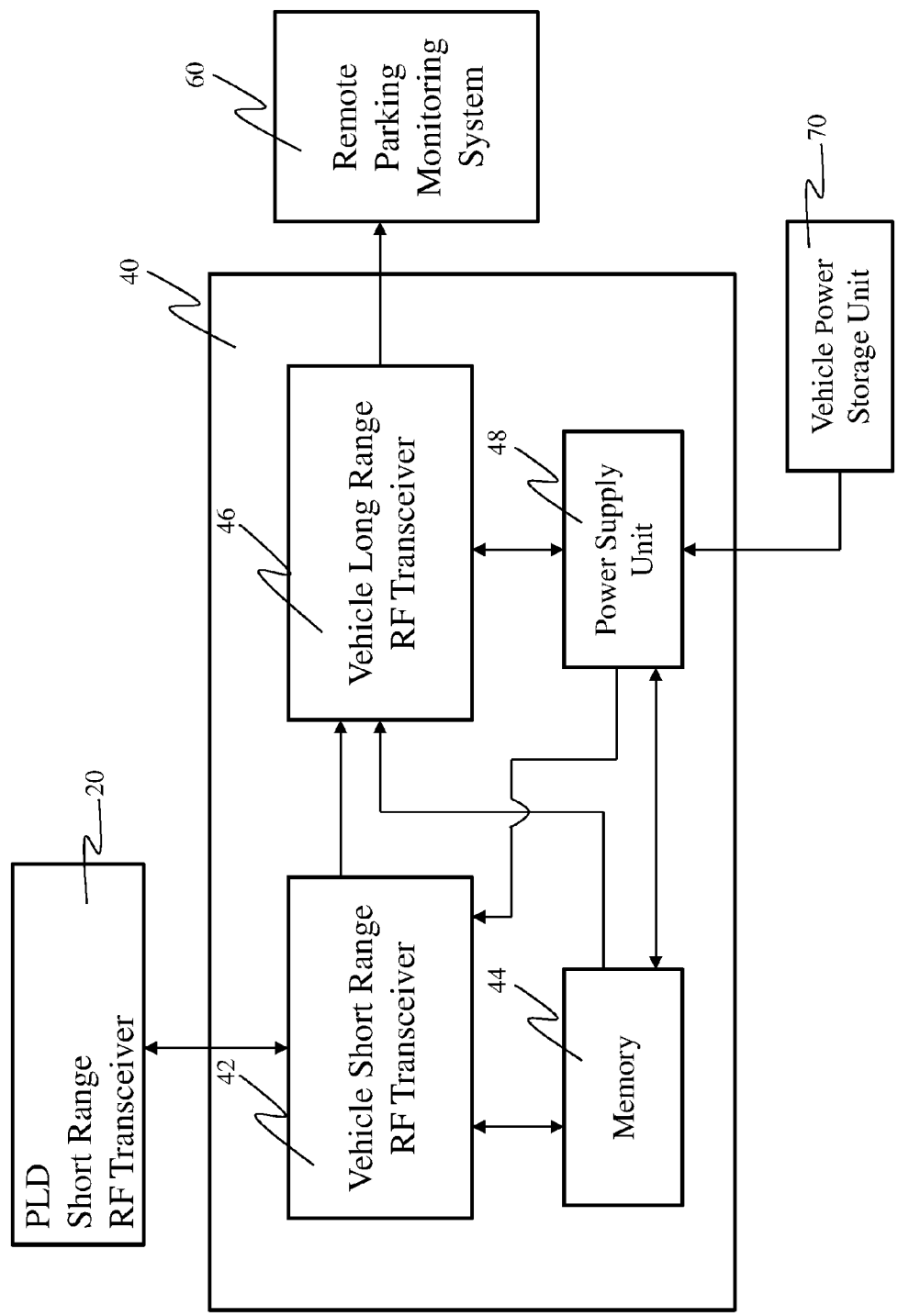
FIG. 4 illustrates a parking vehicle device in accordance with an embodiment of the present invention.

Referring to FIG. 4, in an aspect of the invention, there is provided a parking vehicle device (PVD) 40 comprising a short range RF transceiver 42 (also named PVD SR RF Transceiver), a vehicle long range RF transceiver 46 (also named PVD LR RF Transceiver), a memory 44 and power source unit 48.

In an embodiment of the invention, the PVD SR RF Transceiver 42 is adapted to be in short range radio frequency communication with the PLD SR RF Transceiver 20 through which a short range RF signal comprising a unique lot identifier is transmitted by the PLD SR RF Transceiver 20 to the PVD SR RF Transceiver.

In an embodiment of the invention, the PVD SR RF Transceiver 42 transmits a signal to the PLD SR RF Transceiver 20 confirming presence of a vehicle. In an embodiment of the invention, the signal transmitted by the PVD SR RF Transceiver 42 to the PLD SR RF Transceiver 20 is in response to the signal received from the latter. In an embodiment of the invention, the PVD SR RF Transceiver 42 is adapted to send a short range RF signal to wake up the PLD SR RF transceiver from a sleep mode.

In an embodiment of the invention, the PLD SR RF Transceiver 20 is adapted to wake up from sleep and to be activated only when a signal is received from the PVD SR RF Transceiver 42. In an embodiment of the invention, the PLD SR RF Transceiver 20 is adapted to wake up from sleep and to be activated when a signal is received from the PVD SR RF Transceiver 42 and when the solar energy level is determined by the energy level detector 14 to be below the predefined threshold. This last embodiment would allow to avoid waking the signal in case of signal interference, if the signal is received from in proximity vehicle not positioned directly in the parking lot (above the PLD 10). The activation of the PLD SR RF Transceiver 20 comprises transmitting a short range RF signal comprising the parking lot identifier which is captured by the PVD SR RF Transceiver 42.

In an embodiment of the invention, the PVD SR RF Transceiver 42 is adapted to be activated and to send a wake-up signal to the PLD short range RF transceiver 20 only when the vehicle is in a parking position, such as powered off or absence of movement. In an embodiment of the invention, the PVD 40 is further adapted to be connected to the vehicle ignition system to detect whether the vehicle is powered on or off.

In an embodiment of the invention, the PVD SR RF Transceiver 42 is configured to be in a sleep mode and to be activated only at the receipt of a wake up signal from the RPMS 60. In an embodiment of the invention, the PVD 40 comprises a geolocation tracking system such as a GPS (not shown) which transmits the location of the vehicle to the RPMS 60. The latter is adapted to determine whether the vehicle is a parking zone based on the location of the vehicle and pre-stored parking zones locations and to send a wake-up signal to the PVD 40 in case the vehicle is determined by the RPMS to be in a parking zone.

In an embodiment of the invention, the wake-up signal is received from the RPMS by the PVD LR RF Transceiver 46. A wake-up signal is then transmitted to the PVD SR RF transceiver 42 for sending a wake-up signal to the PLD SR RF Transceiver 20. In an embodiment of the invention, the PVD SR RF Transceiver 42 starts sending wake-up signals at different time intervals until a response signal is received from the PLD SR RF Transceiver 20.

In an embodiment of the invention, the PVD LR RF Transceiver 46 is adapted to be in long range radio frequency communication with the RPMS 60 for transmitting thereto an indication of the occupancy of the parking lot associated to the unique parking lot identifier received from the PLD 10. The long range RF signal transmitted by the PVD LR RF Transceiver 46 to the RPMS 60 comprises the unique parking lot identifier.

In an embodiment of the invention, the parking lot identifier is stored inside the PVD memory 44 accessible to the PVD LR RF Transceiver 46. In an embodiment of the invention, the parking lot identifier is transmitted directly from the PVD SR RF transceiver 42 to the PVD LR RF Transceiver 46.

In an embodiment of the invention, the energy level detector 16 of the PLD 10 is adapted to detect when a vehicle leaves a parking lot through a detection of a variation in the level of energy. According to an embodiment of the invention, the PLD SR RF Transceiver 20 is adapted to send a sleep signal to the PVD SR RF Transceiver 42 to put the PVD 40 in a sleep mode as the vehicle is leaving the parking.

In an embodiment of the invention, the power source unit 48 comprises a battery. In an embodiment of the invention, the power source unit 48 comprises an electrical regulator adapted to be connected to the vehicle power storage unit 70 (such as the vehicle battery) for receiving electrical power and regulating said power for purpose of use by the electronic components of the PVD 40.

In an embodiment of the invention, the memory 44 comprises vehicle and/or driver identification information such as the vehicle plate number and/or driver license number. In an embodiment of the invention, the vehicle and/or driver identification information is transmitted by the PVD LR RD transceiver 46 to the RPMS 60.

Examples of low power Short range communications are ZigBee, ANT, Bluetooth with 2.4 GHz frequency or any other suitable technology. The power consumption of short range communication technologies is normally around 0.1 watt. Examples of long range communications are GPRS (General Packet Radio Service)/GSM. The power consumption of long range communication technologies is normally around 2 watt.

As a further aspect of the invention, there is provided a network comprising a plurality of parking lot devices 10 deployed in respective parking lots, a plurality of parking vehicle devices 40 deployed at respective vehicles and a RPMS 60 configured in accordance with the various embodiments of the present invention.

The invention claimed is:

1. A parking lot device (PLD) adapted to be mounted in a parking lot comprising:
   a solar cell for capturing and converting solar energy into electrical energy;
   an energy storage unit adapted to be connected to the solar cell for storing the electrical energy and providing electrical power supply to the PLD;
   an energy level detector adapted to be connected to the solar cell for providing an indication when a level of energy captured by the solar cell is below a predefined energy level threshold set in such a manner to be indicative of a presence or absence of an obstacle shadowing the solar cell;
   a memory storing a parking lot identifier associated with the parking lot;
   a short range radio frequency transceiver (PLD SR RF Transceiver) adapted to be activated when the solar energy level is determined by the energy level detector to be below the predefined energy level threshold for transmitting a short range radio frequency signal comprising the parking lot identifier, wherein the transmitted signal is adapted to be received by a short range radio frequency transceiver associated with a parking vehicle device (PVD) located at vehicle parked inside the parking lot.

2. The parking lot device as claimed in claim 1, wherein the PLD SR RF Transceiver is adapted to be by default in a sleep mode and to be activated only when the level of solar captured is below the energy level threshold as determined by the energy level detector.

3. The parking lot device as claimed in claim 2, wherein the PLD SR RF Transceiver is adapted to return to a sleep mode immediately after transmitting the signal comprising the parking lot identifier to the PVD.

4. The parking lot device as claimed in claim 2, wherein the PLD SR RF Transceiver is adapted to return to a sleep mode when the level of solar energy captured passes beyond the energy level threshold as determined by the energy level detector.

5. The parking lot device as claimed in claim 1 further comprising an infrared detector adapted to be activated to confirm presence of an obstacle in case the solar energy level detected falls below the predefined threshold, wherein the PLD SR RF Transceiver is adapted to be activated only once presence of an obstacle is confirmed by the infrared detector.

6. The parking lot device as claimed in claim 5, wherein the infrared detector is by default in a sleep mode and activated only when the solar energy level detected falls below the predefined threshold.

7. The parking lot device as claimed in claim 1 further comprising a clock and the memory further stores a night schedule, wherein the infrared detector is adapted to be activated only during the night schedule.

8. The parking lot device as claimed in claim 1 wherein the energy storage unit is a battery or a capacitor.

9. A parking system comprising:
   a parking lot device (PLD) adapted to be mounted in a parking lot comprising:
      a solar cell for capturing and converting solar energy into electrical energy;
      an energy storage unit adapted to be connected to the solar cell for storing the electrical energy and providing electrical power supply to the PLD;
      an energy level detector adapted to be connected to the solar cell for providing an indication when a level of energy captured by the solar cell is below a predefined energy level threshold set in such a manner to be indicative of a presence or absence of an obstacle shadowing the solar cell;
      a memory storing a parking lot identifier associated with the parking lot;
      a short range radio frequency transceiver (PLD SR RF Transceiver) adapted to be activated when the solar energy level is determined by the energy level detector to be below the predefined energy level threshold for transmitting a short range radio frequency signal comprising the parking lot identifier;
   a parking vehicle device (PVD) adapted to be mounted at a vehicle comprising:
      a short range radio frequency transceiver (PVD SR RF Transceiver) adapted to be in radio frequency communication with the PLD SR RF Transceiver for receiving the short range radio frequency signal comprising the parking lot identifier;
      a long range radio frequency transceiver (PVD LR RF Transceiver) adapted to be in communication with a remote parking monitoring system (RPMS) for transmitting thereto an indication of the occupancy of the parking lot associated with the parking lot identifier;
      a power supply unit adapted to receive electrical power from a vehicle power storage unit, to regulate and provide the power to the PVD.

10. The system as claimed in claim 9 wherein the PLD SR RF Transceiver is adapted to be by default in a sleep mode and to be activated only upon receipt of an activation signal from the PVD SR RF Transceiver.

11. The system as claimed in claim 10, wherein the PVD SR RF Transceiver is adapted to send an activation signal to the PLD SR RF Transceiver only after receipt of a wake up signal from the RPMS through the PVD LR RF Transceiver.

12. The system as claimed in claim 11, wherein the parking vehicle device further comprises a geolocation tracking system adapted to transmit a location of the vehicle to the RPMS, and wherein the RPMS is adapted to determine whether the vehicle is within a parking zone and to transmit the wake up signal to the PVD LR RF Transceiver only if the vehicle is determined to be in a parking zone.

13. The parking system as claimed in claim 9, wherein the PLD SR RF Transceiver is adapted to be by default in a sleep mode and to be activated only when the level of solar captured is below the energy level threshold as determined by the energy level detector.

14. The parking system as claimed in claim 13, wherein the PLD SR RF Transceiver is adapted to return to a sleep mode immediately after transmitting the signal comprising the parking lot identifier to the PVD.

15. The parking system as claimed in claim 13, wherein the PLD SR RF Transceiver is adapted to return to a sleep mode when the level of solar energy captured passes beyond the energy level threshold as determined by the energy level detector.

* * * * *